United States Patent
de Jong

(10) Patent No.: US 9,922,801 B2
(45) Date of Patent: Mar. 20, 2018

(54) DRYING APPARATUS FOR USE IN A LITHOGRAPHY SYSTEM

(71) Applicant: Mapper Lithography IP B.V., Delft (NL)

(72) Inventor: Hendrik Jan de Jong, The Hague (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 568 days.

(21) Appl. No.: 14/463,711

(22) Filed: Aug. 20, 2014

(65) Prior Publication Data

US 2015/0052776 A1    Feb. 26, 2015

Related U.S. Application Data

(60) Provisional application No. 61/869,093, filed on Aug. 23, 2013.

(51) Int. Cl.
| | | |
|---|---|---|
| *H01J 37/317* | (2006.01) | |
| *H01L 21/67* | (2006.01) | |
| *F26B 21/00* | (2006.01) | |
| *H01J 37/20* | (2006.01) | |

(52) U.S. Cl.
CPC ........ *H01J 37/3177* (2013.01); *F26B 21/004* (2013.01); *H01J 37/20* (2013.01); *H01L 21/67034* (2013.01); *H01J 2237/0437* (2013.01)

(58) Field of Classification Search
CPC ............. F26B 21/004; H01L 21/67034; B05C 11/1039
See application file for complete search history.

(56) References Cited

U.S. PATENT DOCUMENTS

| | | |
|---|---|---|
| 5,660,642 A | 8/1997 | Britten |
| 5,871,584 A | 2/1999 | Tateyama et al. |
| 6,446,358 B1 | 9/2002 | Mitsumori et al. |
| 6,742,281 B2 | 6/2004 | Shin et al. |
| 6,897,458 B2 | 5/2005 | Wieland et al. |

(Continued)

FOREIGN PATENT DOCUMENTS

| | | | |
|---|---|---|---|
| GB | 920034 A * | 3/1963 | .............. F26B 13/10 |
| JP | 2011 124431 A2 | 6/2011 | |

(Continued)

OTHER PUBLICATIONS

Laytner, F. 'Fundamentals and Technology of Wafer Drying', The University of British Columbia, Aug. 1989, p. 1-335.

*Primary Examiner* — David J Laux
(74) *Attorney, Agent, or Firm* — Hoyng Rock Monegier LLP; David P. Owen

(57) ABSTRACT

The invention relates to a drying apparatus for use in a lithography system for drying at least part of a surface on a first side of a planar target, such as a wafer. The apparatus has a drying device for eliminating liquid or droplets thereof from the first side of the planar target. The drying device has a first slit and a second slit arranged in close proximity of the target. A gap is present between the target and the drying device. Pressurized gas may be supplied via the first slit into the gap. The liquid may be discharged from the target by means of the pressurized gas through the second slit. The first and the second slit are configured to enable the pressurized gas to flow along the first side of the planar target substantially parallel to the planar target.

18 Claims, 5 Drawing Sheets

(56) References Cited

U.S. PATENT DOCUMENTS

| | | |
|---|---|---|
| 6,958,804 B2 | 10/2005 | Wieland et al. |
| 7,019,908 B2 | 3/2006 | van 't Spijker et al. |
| 7,084,414 B2 | 8/2006 | Wieland et al. |
| 7,129,502 B2 | 10/2006 | Kruit |
| 7,181,863 B2 | 2/2007 | Ferrell et al. |
| 7,367,345 B1 * | 5/2008 | Hemker .............. G03F 7/70341 134/115 R |
| 7,931,755 B2 * | 4/2011 | Nishio .................... B08B 5/023 134/36 |
| 8,089,056 B2 | 1/2012 | Wieland et al. |
| 8,198,602 B2 | 6/2012 | Steenbrink et al. |
| 8,445,869 B2 | 5/2013 | Wieland et al. |
| 8,502,174 B2 | 8/2013 | Wieland |
| 8,890,094 B2 | 11/2014 | Wieland et al. |
| 2001/0010997 A1 | 8/2001 | Okumura |
| 2006/0218815 A1 | 10/2006 | Miya |
| 2007/0064213 A1 | 3/2007 | Remco et al. |
| 2012/0069309 A1 | 3/2012 | Willems et al. |

FOREIGN PATENT DOCUMENTS

| | | |
|---|---|---|
| KR | 2003 0039318 A | 5/2003 |
| WO | WO 2003 041131 A2 | 5/2003 |
| WO | WO 2009 011574 A1 | 1/2009 |

\* cited by examiner

DRYING APPARATUS FOR USE IN A LITHOGRAPHY SYSTEM

BACKGROUND OF THE INVENTION

1. Field of the Invention

The present invention relates to a drying apparatus for drying a surface of a planar target, such as a wafer, for use in a lithography system for projecting an image pattern onto the target. The present invention further relates to a lithography system comprising such a drying apparatus. Finally, the present invention further relates to a method for drying a planar target.

2. Description of the Related Art

In known lithography systems, the target, such as a wafer, to be patterned is subjected to incidence of photons or charged particles such as ions and electrons. So as to realize high precision patterning of the target, it is to be firmly bonded or connected to a target table (or wafer table) by means of which the target is moved relative to the source of incidence, at least if position measurement of said target is performed via said target table. It is preferably also to remain in position relative to said table during handling of the target, e.g. during insertion and removal of the target to and from the position where it is to be processed.

Various solutions exist for meeting the above requirements, e.g. by means of electromechanical clamping or clamping by capillary action using a fluid and causing the wafer undesirably to become wet. An example of such a clamping system utilising capillary clamping is for example known from International Application WO2009/011574.

In the known system a target is included in a lithography system by means of a target table and clamping means are present for clamping said target on said table. Said clamping means comprises a layer of stationary liquid, included at such thickness between target and target table that, provided the material of the liquid and of the respective contacting faces of the target and target table, a pressure drop arises. The stationary fluid may be for example water. After patterning, the target and target table are removed from the lithography system and unclamped. i.e. the target and target table are separated.

In the known clamping system, after unclamping the target needs to be dried before returning back to further processing, such as a coater/developer track. The target backside may be wet with liquid droplets (such as water droplets) after unclamping from the capillary clamping table. Liquid spots left on the wafer surface can cause oxidation that damages components on the wafer.

Besides the known clamping system, other stages of the lithography process such as coating, etching and cleaning may leave liquid on the target when the wafer is processed. In a lithography system, especially in a vacuum system, these liquid droplets inside system should be avoided as these may contaminate the wafer during further processing or interfere with the rest of the system. The wafer thus should be dried before it is further processed.

Since the target is to be processed in a lithography system, there are several requirements placed on the drying apparatus. The target should be dry enough, i.e. no liquid or droplets remain, since any remaining liquid or droplets may still negatively influence the lithography process.

Further, the drying apparatus should not add contamination to the target whilst drying, again to not negatively influence the lithography process. Since a target such as a wafer passes through the entire lithography system, any contamination present on the target will spread throughout the entire system.

After drying the target may need to be processed further. For some stages of processing, it is required that the temperature of the target is controlled, thus the drying apparatus should not raise or lower the temperature of the target in a manner that disrupts the lithography process Due to limited space, which is also highly expensive, available in cleanrooms where lithography processes typically take place, the drying apparatus should preferably be of a small and compact size relative to the lithography system.

Several ways of drying are known in the art. A first known way of drying is spin drying, where the target or wafer is spun and the centrifugal force removes the liquid or droplets. Spin drying typically takes place at speeds of 2000 rpm. Ideally, wafers are spun off-axis e.g. spun around an axis that does not coincide with the center of the target. Disadvantages of this method are that spinning the wafer, especially off-axis, introduces unwanted vibrations. Also, off-axis spinning increases the footprint of the drying apparatus, which is not wanted. If on-axis drying in used, e.g. the wafer is spun around the center of the wafer, it was found that large residual droplets are left on the wafer.

Another know way of drying wafers is by using an "air knife". In such systems, the wafer passes through an high speed gas flow (e.g. nitrogen, $N_2$) to remove droplets by blowing them away from the surface of the target. Typical flow speeds for the gas are 50 m/s to 200 m/s. In this manner droplets are blown away, not evaporated. This type of drying is often employed in laboratories, and is not typically used in industrial lithography applications. A disadvantage is the use of an air knife place high aerodynamic forces are exerted on wafers. Typical wafers are of 300 mm size and can fail when exposed to the forces exerted by the air knife. Further, since the liquid is blown away and not evaporated, the liquid may contaminate other parts of the system.

Another known way of drying wafers which is commonly used in lithography processing is Marangoni drying. In this process, a wafer is vertically retracted from a liquid bath, typically water. IPA (isopropyl alcohol) vapour and heated $N_2$ is made to flow over the wafer, causing a surface tension gradient in the liquid. This allows the liquid film to smoothly recede from the wafer since the presence of a gradient in surface tension will naturally cause the liquid to flow away from regions of low surface tension. The heated $N_2$ flows across the wafer to evaporate the IPA. A typical Marangoni drying speed is 6 mm/s leading to a total drying time of 50 s for a 300 mm wafer. Disadvantages of Marangoni drying include the complexity and size of the drying system since the wafers have to be vertically pulled and the relatively low drying speed.

It has been suggested to combine Marangoni drying with an air knife, where the wafer is passed through an IPA saturated air knife. It is however not clear if the surface tension gradient may also occur in the turbulent aerodynamic conditions in the air knife. Also, residual condensed IPA is blown away by the air knife in an uncontrolled manned, and can cause contamination of the system.

Marangoni drying may further be combined with a form of spin drying (then called Rotagoni drying) where the IPA displaces the liquid on the wafer under centrifugal force, the IPA then evaporates. Besides the disadvantages outlined above under spin drying and Marangoni drying, this combined technique is normally only useful for the top wafer surface.

The use of wipers has also been suggested for drying wafers, it was found however that liquid drops may remain on the wafer using a wiper. The removed liquid remains on the wiper and may fall off, contaminating the system. Also, bottom of the wafer is touched by the wiper, which is undesirable and may lead to contamination of the wafer.

Applying heat is a known way of drying, but is relatively slow for wafer drying and may leave spots on the wafer. Conversely, freeze drying may be used, however the very low temperatures may have adverse effects on the wafer.

BRIEF SUMMARY OF THE INVENTION

A goal of the present invention is to overcome the problems as identified in the known systems, in particular to provide a system to dry a wafer after unclamping.

This goal is achieved by providing a drying apparatus comprising a drying device (hereafter also referred to as a "dryer") which comprises a first slit and a second slit arranged in close proximity of the target, a gap being present between the target and the dryer, the first slit included for supplying pressurised gas into said gap directed to the target, the second slit included for discharging said liquid by means of said gas away from the target.

A dryer transverses along the backside of the wafer and has two slits along its width.

A first slit being an exit slit, blowing dry air or nitrogen ($N_2$) against the wafer backside.

A second slit, through which the air or $N_2$ flow is sucked by vacuum back into the dryer.

As the drying device traverses the length of wafer, droplets are removed by the suction of the second slit, i.e. the air suction slit, at the leading edge of the dryer. The first slit i.e. the air exit slit provides an air or $N_2$ flow parallel to the wafer in the dryer movement direction. It ensures that droplets are pushed towards the air suction slit, leaving a dry wafer backside behind. The complete drying of the wafer in this manner is of high importance.

By ensuring that the suction slit flowrate is equal to or greater than the exit slit flow rate, droplets are not blown away into the outside environment. Instead the suction ensures that all droplets are removed in a controlled manner.

This dryer can alternatively also work upside-down, useful for drying the wafer topside or wafer table surface.

BRIEF DESCRIPTION OF THE DRAWINGS

These and other objects of the invention will be further elucidated with reference to the figures, in which:

FIG. 3b schematically shows a cross-sectional side view of a portion of the lithography system of FIG. 3a;

DESCRIPTION OF ILLUSTRATIVE EMBODIMENTS

Figure 1:
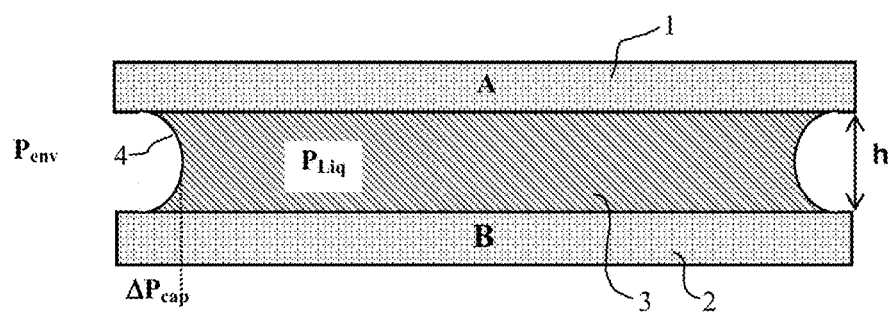
FIG. 1 in sectional view schematically illustrates a known clamping system comprising liquid, capillary included between two plate like structures.

FIG. 1 in sectional view schematically illustrates a known clamping system for use in a known lithography system, comprising a lithography target, here in the form of a wafer 1, which normally moves relative to e.g. a charged particle beam column of a lithography apparatus, or other kind of beam source for lithography, by means of an actuated target table or chuck, not indicated in this drawing. Between a top side of such target table 2 and said target 1, a volume of liquid 3 in included capillary. To this end the target 1 and top surface 2 have a mutual nominal distance of gap height h. The volume of liquid, according to the invention preferably water, is such that the radius of the target, as taken in top view, is virtually met by a radius R of the capillary included liquid 3. In any case, the radius of an incircle of the target is at least met by the radius of an excircle fitting the volume of liquid within the boundary of the target. The thus included liquid 3 forms a liquid surface 4, alternatively denoted fluid interface 4 at it's outer periphery which, as taken in the section according to FIG. 1, is generally concavely shaped, due to adhesive connection of the liquid to the target 1 and the top side 2 of a target table respectively. This concave surface 4 tends to maintain its shape at pulling the target and target table apart, and depends on pressure differential.

Figure 2:
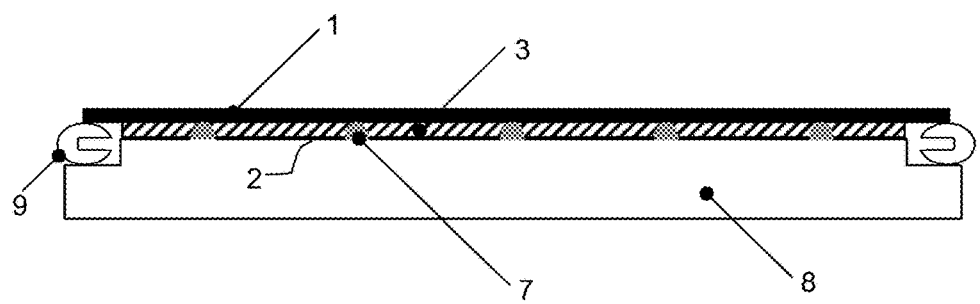
FIG. 2 by sectional view of part of a lithography system, schematically represents a practical implementation of a wafer clamp.

FIG. 2 illustrates a practical elaboration on the known principle and schematically shows part of a lithographic system, including a target 1 embodied by a wafer, a top side 2 of a wafer table 8 or chuck part, a liquid 3 usually in the form of water. Optionally, a so called "Viton" or rubber O-ring 9 is present. The optional O-rings 9 seal off liquid vapour evaporating from the gap containing liquid 3, which is especially an issue in the vacuum environment in which such lithography means may be applied, by being inserted in a rim part of reduced height of the wafer table 8. The top side of the O-ring is set to a level corresponding in height to that of, and preferably being slightly higher than that of burls 7 on the top side of wafer table 8.

Figure 3A:
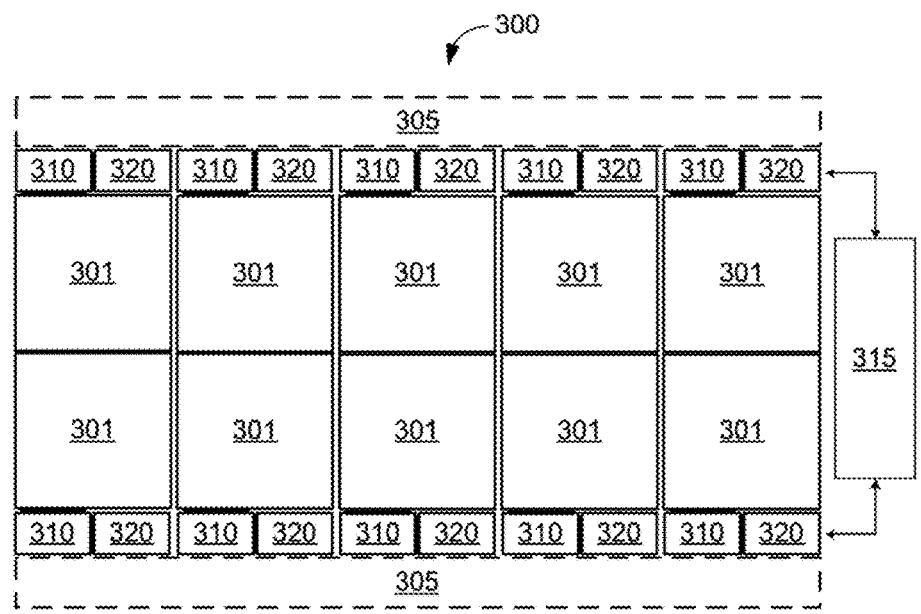
FIG. 3a shows a top view of a layout of lithography system according to an embodiment of the invention.

FIG. 3a shows a top view of a layout of lithography system 300 comprising a group of lithography system units according to an embodiment of the invention. Hereinafter, the layout may be referred to as lithography system 300 or cluster 300.

Such lithography systems are described for example in U.S. Pat. Nos. 6,897,458 and 6,958,804 and 7,019,908 and 7,084,414 and 7,129,502, U.S. patent application publication No. 2007/0064213, and U.S. patent application Ser. Nos. 61/031,573 and 61/031,594 and 61/045,243 and 61/055,839 and 61/058,596 and 61/101,682, which are all assigned to the owner of the present invention and are all hereby incorporated by reference in their entirety.

Figure 3B:
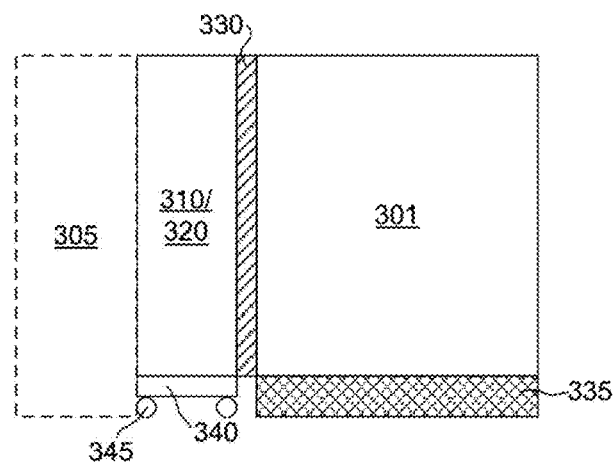

FIG. 3b schematically shows a cross-sectional side view of a portion of the lithography system 300. In this particular embodiment, the lithography system 300 comprises a group of ten lithography system units. The lithography system units are arranged back-to-back in two rows of five. Directly adjacent to the cluster 300, floor space is reserved as service area 305. Each lithography system unit comprises a lithography apparatus 301 that is contained in its own vacuum chamber, with one side of each vacuum chamber facing a lithography system unit in the other row, while the opposing side faces the surroundings of the cluster 300, in particular the service area 305.

In case of a charged particle lithography apparatus, the vacuum chamber preferably comprises all elements that enable lithography processing, including a charged particle source, a projector system for projecting charged particle beamlets onto a substrate to be patterned, and a moveable substrate stage.

The side of the lithography system unit facing the surroundings comprises a load lock system 310 for transferring substrates into and out of the vacuum chamber, and also comprises an access door 330 that can be opened for service purposes.

The lithography system units are provided with a door 330 at the same side as the load lock system 310. The door 330 may be removably attachable, and may be removable in its entirety, for example by using a transfer unit 340. The transfer unit 340 may be arranged to support the door 330 and may comprise one or more transfer elements 345, such as wheels or rails. The lithography apparatus 301 may be supported by a supporting structure 335 for positioning the lithography apparatus at an elevated position.

The lithography system 300 thus comprises a plurality of lithography system units having a load lock system 310 and a door 330 facing the surroundings, more in particular facing the service area 305 surrounding the lithography system 300. Due to the "outward" orientation of the load lock systems 310 and doors 330, the lithography system units, including the lithography apparatuses 301 within the vacuum chambers, are directly accessible from the service area 305. Direct access simplifies servicing of the lithography system 300, and may reduce the downtime of the lithography system or parts thereof. Opening a single specific vacuum chamber for servicing can be done without affecting the throughput of other lithographic system units within the lithography system 300.

The load lock system 310 may be integrated into the door 330. Integration of the load lock system 310 and the door 330 reduces the amount of material used in manufacturing the lithography system unit. A portion of the door 330 may be directly used as one of the side walls of the load lock system 310. The material reduction has the advantage that the door and load lock system combination is easier to handle during servicing. Furthermore, as less material is needed during manufacturing, the costs of manufacturing the lithography system are reduced as well.

The lithography system 300 further comprises a substrate supply system 315. The substrate supply system 315 is arranged to receive substrates to be processed by the lithography system 300, and to provide these substrates to the lithography system units for processing. This can effectively mean that the substrate supply system 315 provides the substrates to a preparation system 320 for pre-processing purposes. After patterning, the substrate supply system 315 may collect the patterned substrates. The use of a substrate supply system 315 enables the lithography system 300 to efficiently cooperate with other equipment in the fab as it allows for a relatively easy replacement of presently used lithography systems.

Before entry into the vacuum chamber, a substrate typically undergoes the actions of clamping, pre-alignment and pump down. In this context, clamping is defined as providing a substrate on a substrate support structure to form a single structure, hereafter referred to as "clamp". Furthermore, the term "clamped substrate" is used to refer to a substrate being clamped to a substrate support structure.

Pre-alignment relates to aligning the substrate and/or clamp such that patterning can be performed onto a predetermined portion of the substrate in a certain orientation. Pump down relates to the step of reducing the pressure surrounding the substrate to minimize contamination and to reduce the influence of the substrate on the vacuum chamber pressure upon insertion into the lithography apparatus 301.

After the patterning action performed by the lithography apparatus 301, the substrate is typically exposed to a venting action, and an unclamping action, i.e. separating the substrate from the substrate support structure. In between the venting and unclamping actions, the substrate may be transferred.

The load lock system 310 forms an interface to a vacuum environment within the vacuum chamber. The system 310 is typically used for the pump down action and the venting action described above. For this purpose, the load lock system 310 comprises one or more chambers in which the pressure can be regulated. The load lock system 310 may comprise a single chamber suitable for both pump down and venting actions. Alternatively the system 310 comprises separate chambers for pump down and venting. For the pump down action the system 310 comprises pumps for pumping down the pressure within a chamber to a reduced pressure, e.g. a vacuum suitable for transfer of the clamped substrate and substrate support to the lithographic apparatus 301. For the venting action the load lock system 310 comprises vents for venting a chamber to increase the pressure after processing of the clamped substrate in the lithographic apparatus 301.

Clamping and/or unclamping may be performed in the preparation systems 320. Alternatively, the clamping may be performed at a different location prior to providing the substrate to the preparation systems 320, for example within the common supply system 315. In yet another alternative, clamping and/or unclamping may be performed within the load lock system 310. In some instances, the unclamped wafer may be supported for further processing by so-called lift pins, which support the wafer at regular positions on the edge of the substrate around the periphery of the substrate, for instance at 120 degree intervals.

Clamping and unclamping may be performed in separate units, but may also be executed in the same unit. Hereinafter the expression "clamping unit" refers to a unit for clamping and/or unclamping.

After unclamping the wafer may need to be dried if the clamping systems according to FIGS. 1 and 2 was used. In systems where the top of the wafer has a liquid layer to increase the numerical aperture of the optical system, the wafer may also need to be dried after processing in the chamber. Other lithography processes such as cleaning of wafers or wet etching of wafers may also require the wafer to be dried. For these processes the drying unit according to the invention is also suitable. The clamping unit in the preparation system therefore comprises a drying apparatus according to the present invention. It is advantageous to include the dryer in the clamping unit, as this is the first place the wafer is after processing in the lithography system, reducing the risk of cross contamination.

Figure 4:
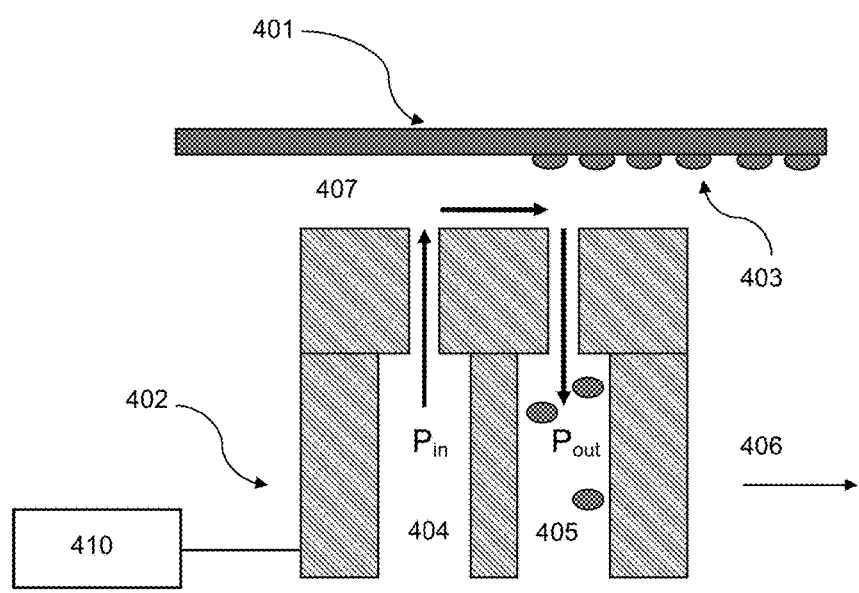
FIG. 4 schematically represents a practical implementation of the idea underlying the present invention.

FIG. 4 represents a practical implementation of the idea underlying the present invention.

The drying apparatus 402 traverses along the wafer 401, in FIG. 4 in direction 406, for example by coupling the drying apparatus 402 to an actuation device 410. The wafer may also be traversed along the dryer. In such case, an actuation device, such as actuation device 410, may be coupled to the wafer 401 to achieve relative movement between the wafer 401 and the drying apparatus 402. The actuation device, in particular if the wafer is to be actuated, may take the form of an actuated wafer table or chuck. A gas such as dry air or $N_2$ is blown onto wafer 401 through a first slit 404 at a pressure $P_{in}$. As the dryer 402 and wafer 401 move relatively to each other the gas is blown into the gap 407 in between the dryer and the wafer. As a lower pressure $P_{out}$ exists in the second slit 405, the removed water droplets are carried by the gasflow (indicated by the three arrows in FIG. 4) into second slit 405 to transfer the droplets out of the gap 407 between the dryer and the wafer. According to the invention, the gas flows from the first slit, along the surface of the target and exits through the second slit. In this manner liquid droplets 403 are blown away and removed from the wafer. Preferably, the direction of flow is in the direction of the relative movement between dryer and wafer, to ensure that even if a water droplet is not carried into the second slit, it will be pushed forward by the gasflow instead of left on the wafer.

Preferably, no flow exists in other directions along the surface of the wafer, for example along the wafer outside of the flow of gas, since the droplets carried by the flow can contaminate the lithography system. In order to achieve this the outlet pressure $P_{out}$ should be low enough, whilst the gap 407 is relatively small. When gap 407 is too large, the optimal flow cannot easily be achieved. Conversely, the gap 407 should not be so small that the wafer is sucked onto the dryer and becomes stuck, possibly damaging the wafer. It was found that a minimum gap height of approximately 0.5 mm is optimal, with an airflow of about 25 m/s. The width of slit 404 was found to be optimal at 0.5 mm to supply the required flow, while slit 405 has an optimal width of 1 mm to allow the water droplets to exit. This setup in practice results in that larger liquid droplets, ie. droplets larger than approximately 1 mm in diameter are blown away, whilst smaller droplets evaporate within a short time of about 30 seconds after drying.

It is advantageous that the wafer is not physically contacted by the drying apparatus, reducing the risk of contamination of the wafer. Preferably, neither the wafer nor the liquid on the wafer are contacted to further reduce the risk of contamination.

Figure 5:
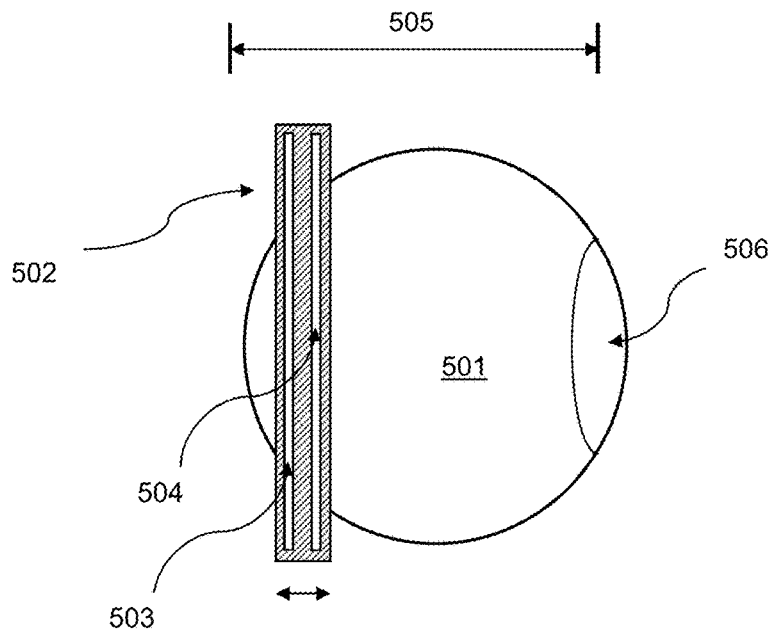
FIG. 5 schematically represents bottom view of a practical implementation of the idea underlying the present invention.

FIG. 5 schematically represents a bottom view of a practical implementation of the idea underlying the present invention.

The wafer bottom 501 (shown from the bottom) is moved relative to the dryer 502 along the length 505 of wafer 501. The gas flows out of the first slit 503 into the gap (not shown) between the dryer and the wafer, removing liquid droplets (not shown). The gas flow exits the gap through the second slit 504. In this example the slits extend along the entire width of wafer 501, however it was found that it is not always necessary to dry the entire wafer. Preferably, the first and second slit extend over the entire width of the wafer, allowing the entire wafer to be dried in one pass thus increasing throughput. In certain processes, for example after the wafer was clamped and unclamped according to the process of FIGS. 1 and 2, only a small area 506 may remain wet. In these circumstances it the dryer may applied using smaller slits only covering the width of the wet spot 506. It is then also not necessary to traverse the entire length 505 of the wafer, again merely drying the length of wet spot 506. This has the advantage that a smaller drying apparatus can be used. Also, by only drying the wet spot 506, it is ensured that the drying device does not interfere with lift pins that support the wafer after unclamping.

It was found that when using the drying apparatus, in certain circumstances the top of the wafer may also become wet at the edge of the wafer where remaining droplets are blown from the bottom of the wafer to the top when the dryer traverses the edge of the wafer. This may occur because the droplets are blown in the direction of relative motion between the dryer and the wafer. While this ensures that all droplets are removed, some droplets may migrate to the top of the wafer.

Figure 6:
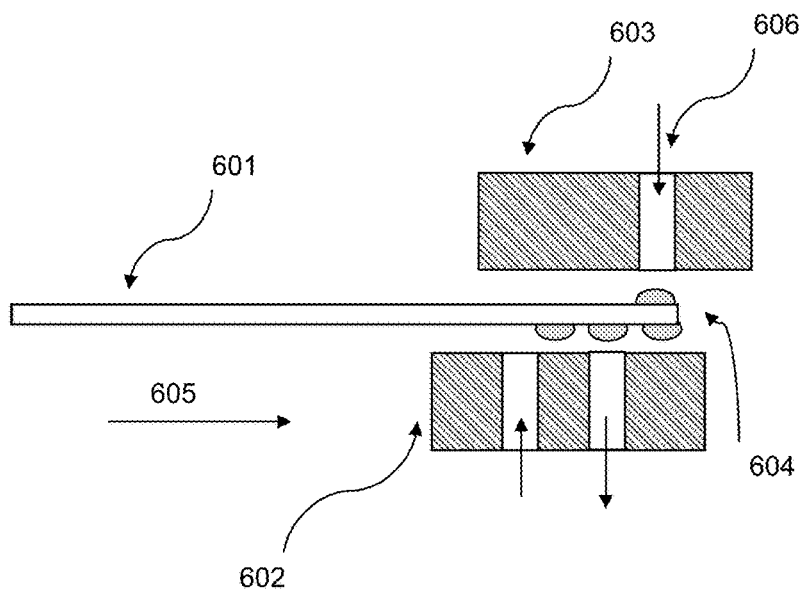
FIG. 6 schematically shows an alternative arrangement of the dryer.

FIG. 6 schematically shows an alternative arrangement of the dryer for preventing the droplets migrating to the top of the wafer. Wafer 601 is traversed in direction 605 by dryer 602 drying the wafer in the manner of FIGS. 5 and 6. A second arrangement 603 is present comprising a third slit 606 adapted for supplying gas on top of the wafer at the edge where droplets may migrate. Second arrangement 603 is static with regard to the wafer. When the pressure provided by the gas flow is sufficient, droplets from the bottom are prevented from migrating to the top of the wafer and are carried away from the wafer by the second slit as in the previous examples. Typically, the gasflow supplied by the third slit is supplied from about 15 mm above the wafer. This proved to be sufficient.

As in FIG. 5, in certain cases it may only be required to supply gasflow to part of the top edge of the wafer.

Figure 7:
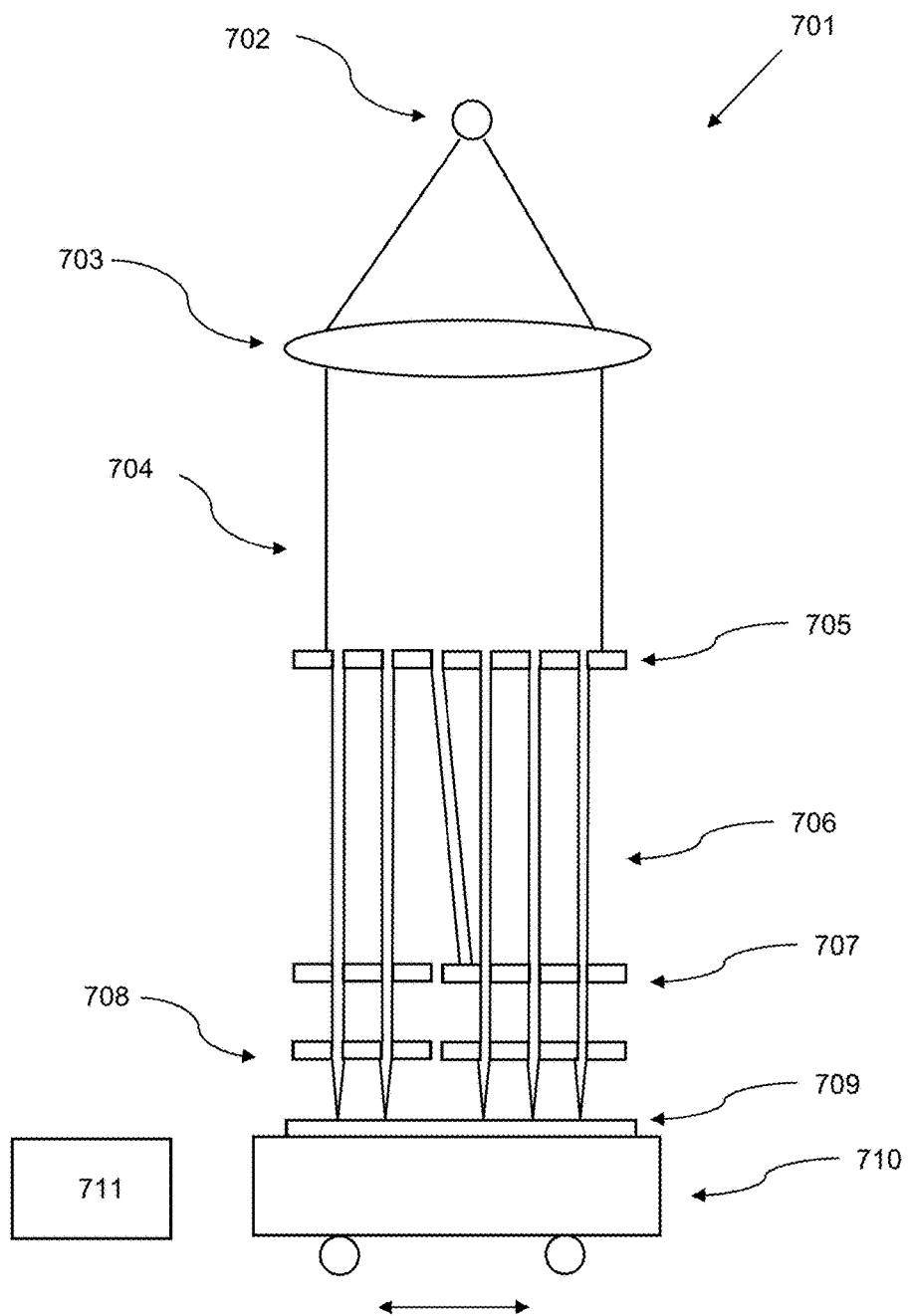
FIG. 7 schematically shows an example of a charged particle multi-beamlet lithography system that may be used in embodiments of the present invention.

FIG. 7 shows a simplified schematic drawing in cross-section of an example of a charged particle multi-beamlet lithography system for transferring a pattern onto the surface of a planar target. Such an system suitably comprises a beam generator 701 comprising a source 702 for emitting a diverging charged particle beam, a collimator lens 703 for collimating the charged particle beam into a collimated beam 704 and a modulation system 705. The modulation system 705 comprises an aperture array for generating a plurality of substantially parallel charged particle beamlets 706. In addition the modulation system comprises a plurality of blanking deflectors for deflecting the charged particle beamlets 706 in accordance with pattern data. At a distance from the aperture array 705 a beam stop array 707 is arranged. When the charged particle beamlets 706 are not deflected by the blanking deflector, the charged particle beamlets pass through openings in the beam stop array 707 and are projected onto a planar target 709 such as a wafer via a projection system 708, e.g. a system comprising one or more lenses, such as electrostatic lenses, arranged directly below the beam stop array 707. When the blanking deflector for one of the charged particle beamlets 706 is activated, the corresponding charged particle beamlet is deflected and is blocked by the beam stop array 707. By activating or not activating the blanking deflector, the beamlets can be modulated, and patterned beamlets may be formed. The system further comprises a positioning system 710 for positioning the target and the projection system relative to each other. The system may further comprise a drying apparatus 711, for example a drying apparatus according to any one of the embodiments described above.

Although some embodiments of the invention have been described with reference to a lithography system comprising ten lithography system units, the number of lithography system units within a lithography system may vary. For example, instead of ten lithography system units, any other number of lithography system units above one may be used.

The invention has been described by reference to certain embodiments discussed above. It will be recognized that these embodiments are susceptible to various modifications and alternative forms well known to those of skill in the art without departing from the spirit and scope of the invention.

Accordingly, although specific embodiments have been described, these are examples only and are not limiting upon the scope of the invention, which is defined in the accompanying claims.

What is claimed is:

1. Drying apparatus for use in a lithography system for drying at least part of a surface on a first surface of a planar target, the planar target having a first surface and a second surface extending in a planar direction of the planar target, the apparatus comprising a drying device for eliminating liquid or droplets thereof from the first surface of the planar target, wherein said drying device comprises a first slit and a second slit, the drying device to be arranged with the first slit and the second slit facing the first side of the planar target and such that a gap is present between the planar target and the drying device, wherein the first slit is included for supplying pressurised gas into said gap directed to the target, wherein the second slit is included for discharging said liquid by means of said pressurized gas away from the planar target, and wherein the first and the second slit are configured to enable the pressurized gas to flow along said first surface of the planar target substantially parallel to the planar target,
 wherein the drying apparatus further comprises an actuation device for relatively moving the drying device and the planar target with respect to one another in a direction of the gas flow along the surface of the planar target,
 the apparatus further comprising a third slit configured to blow a gas onto an edge of the planar target, wherein the third slit is included for blowing gas onto the edge of the planar target on a second surface opposite to the first surface of the planar target to prevent droplets from migrating from the first surface to the second surface, and wherein the third slit is arranged to be static with regard to the target.

2. Apparatus according to claim 1, wherein the first slit and the second slit are included substantially parallel to one another.

3. Apparatus according to claim 1, wherein the first slit is configured to blow gas towards the planar target in a direction substantially perpendicular to the first surface of the planar target, and wherein the second slit is configured to transport gas and liquid away from the target in a direction substantially perpendicular to the first surface of the planar target.

4. Apparatus according to claim 1, wherein the drying device is adapted for drying only part of an edge of the planar target.

5. Apparatus according to claim 4 wherein the drying device is adapted for drying an area on the edge of the target with a maximum width of 45 mm.

6. Apparatus according to claim 1, wherein the gas is air or nitrogen.

7. Apparatus according to claim 1, wherein the distance between the drying device and the target is approximately 0.5 mm.

8. Apparatus according to claim 1, wherein the flow rate of the gas in the gap is approximately 25 m/s.

9. Apparatus according to claim 1, wherein a flow rate in the second slit is equal to or greater than the flow rate in the first slit.

10. A charged particle multi-beamlet lithography system for transferring a pattern onto a surface of a planar target, the planar target having a first surface and a second surface extending in a planar direction of the planar target, the system comprising:
 a beam generator for generating a plurality of beamlets;
 a modulation device for deflecting the plurality of beamlets in accordance with pattern data;
 a beamlet stop array for selectively blocking the deflected beamlets so as to form patterned beamlets; and
 a projection system for projecting the patterned beamlets onto the target surface;
 a positioning system for positioning the target and the projection system relative to one another, and
 a drying apparatus for drying at least a part of a surface of said planar target,
 wherein the drying apparatus comprises:
  a drying device for eliminating liquid or droplets thereof from the first surface of the planar target, wherein said drying device comprises: a first slit and a second slit arranged facing the planar target, and such that a gap is present between the planar target and the drying device, wherein the first slit is included for supplying pressurised gas into said gap directed to the target, wherein the second slit is included for discharging said liquid by means of said pressurized gas away from the planar target, and wherein the first and the second slit are configured to enable the pressurized gas to flow along said first surface of the planar target substantially parallel to the planar target,
  an actuation device for relatively moving the drying device and the planar target with respect to one another in a direction of the gas flow along the surface of the planar target, and
  a third slit configured to blow a gas onto an edge of the planar target, wherein the third slit is included for blowing gas onto the edge of the planar target on the second surface opposite to the first surface of the planar target to prevent droplets from migrating from the first surface to the second surface, wherein the third slit is arranged to be static with regard to the target and w.

11. Charged particle multi-beamlet lithography system according to claim 10, further comprising a lithography system unit comprising:
 a vacuum chamber;
 a load lock system forming an interface to the vacuum chamber for transferring targets into and out of the vacuum chamber, the load lock system comprising one or more chambers in which the pressure can be regulated;
 a clamping unit for clamping the target on a substrate support structure prior to transfer into the vacuum chamber and/or for unclamping the target from the substrate support structure after transfer from the vacuum chamber, wherein the drying apparatus is comprised in the clamping unit.

12. Method for drying at least a part of a first surface of a planar target, such as a wafer, the planar target having a first surface and a second surface extending in a planar direction of the planar target, by eliminating liquid or droplets thereof from the first surface of the planar target, the method comprising the steps of:
 providing a drying device comprising a first slit and a second slit;
 providing the planar target;
 arranging the first slit and the second slit facing the first surface of the planar target, thereby providing a gap between the drying device and the planar target;
 moving the first and second slits along the first surface of the planar target;
 supplying pressurised gas into said gap from said first slit, directed to said target, such that said pressurized gas flows along said first surface of the planar target substantially parallel to the planar target; and discharging said liquid or droplets thereof away from the planar target and through said second slit by means of said pressurized gas;

providing a third slit static with regard to the target, and blowing a gas onto an edge of the planar target on a second surface opposite to the first surface of the planar target to prevent droplets from migrating from the first surface to the second surface of the planar target.

13. Method according to claim 12, wherein said discharging takes place at a higher flow rate than said supplying of said pressurized gas.

14. Method according to claim 12, wherein said drying device is arranged such that it does not contact said liquid located on said target.

15. Method according to claim 12, wherein said drying of the planar target is performed after having performed lithography processes on said target.

16. Lithography system for projecting a pattern onto a planar target, the planar target having a first surface and a second surface extending in a planar direction of the planar target, the lithography system comprising:

a group of lithography system units each comprising a vacuum chamber and a load lock system forming an interface to the vacuum chamber, for transferring said target into and out of the vacuum chamber, the load lock system comprising one or more chambers in which the pressure can be regulated, and the vacuum chamber comprising a lithography apparatus; and a clamping unit for clamping the target on a substrate support structure prior to transfer into the vacuum chamber and/or for unclamping the target from the substrate support structure after transfer from the vacuum chamber, the clamping unit comprising a drying apparatus for drying the target after unclamping and/or after processing in the lithography apparatus, wherein the drying apparatus comprises:

a drying device for eliminating liquid or droplets thereof from the first surface of the planar target, wherein said drying device comprises a first slit and a second slit arranged facing the planar target, such that a gap is present between the planar target and the drying device, wherein the first slit is included for supplying pressurised gas into said gap directed to the target, wherein the second slit is included for discharging said liquid by means of said pressurized gas away from the planar target, and wherein the first and the second slit are configured to enable the pressurized gas to flow along said first surface of the planar target substantially parallel to the planar target, an actuation device for relatively moving the drying device and the planar target with respect to one another in a direction of the gas flow along the surface of the planar target, and a third slit configured to blow a gas onto an edge of the planar target, wherein the third slit is included for blowing gas onto the edge of the planar target on the second surface opposite to the first surface of the planar target to prevent droplets from migrating from the first surface to the second surface, and wherein the third slit is arranged to be static with regard to the target.

17. Lithography system according to claim 16, further comprising a substrate supply system arranged to receive substrates to be processed by the lithography system and to provide these substrates to the lithography system units for processing, wherein the substrate supply system comprises the clamping unit.

18. Lithography system according to claim 16, further comprising a substrate supply system arranged to receive substrates to be processed by the lithography system and to provide these substrates to the lithography system units for processing, wherein the substrate supply system is arranged for supplying the substrates to a preparation system for pre-processing purposes, wherein the clamping unit is provided in the preparation system.

* * * * *